March 20, 1962 W. W. MUMFORD ET AL 3,026,490

MICROWAVE COUPLING ARRANGEMENTS

Filed Dec. 28, 1959 2 Sheets-Sheet 1

INVENTORS W. W. MUMFORD
I. TATSUGUCHI
BY John K. Mullarney
ATTORNEY

March 20, 1962 W. W. MUMFORD ET AL 3,026,490

MICROWAVE COUPLING ARRANGEMENTS

Filed Dec. 28, 1959 2 Sheets-Sheet 2

INVENTORS W. W. MUMFORD
I. TATSUGUCHI

BY John K. Mullarney

ATTORNEY

United States Patent Office 3,026,490

Patented Mar. 20, 1962

3,026,490

MICROWAVE COUPLING ARRANGEMENTS

William W. Mumford, Parsippany-Troy Hills Township, Morris County, and Isamu Tatsuguchi, Hanover, N.J., assignors to Bell Telephone Laboratories, Incorporated, New York, N.Y., a corporation of New York Filed Dec. 28, 1959, Ser. No. 862,416
2 Claims. (Cl. 333—11)

This invention relates to microwave transmission systems, and more particularly to coupling arrangements therefor of the hybrid junction type.

High frequency coupling arrangements are well known in the prior art. Such arrangements have been developed for use with coaxial lines, waveguides, and, more recently, microwave printed circuit transmission lines. Microwave printed circuit transmission lines are typically flat strip lines having one or a pair of ground plane conductors with a flat strip conductor disposed in parallel spaced relation to the ground plane conductor or conductors, the microwave energy being propagated thereby in a mode closely approximating the TEM mode.

Numerous types of printed circuit coupling arrangements have been proposed for use with microwave printed circuit transmission lines. For example, the patent to Engleman et al., 2,749,521, shows a hybrid junction type coupling arrangement. For one reason or another, however, existing prior art printed circuit coupling arrangements of the hybrid junction type have been found to be somewhat unsatisfactory. Typically, while the hybrid junctions of the cited patent are of relatively simple construction and therefore easily fabricated and economical, their operating bandwidth is rather limited.

It is an object of this invention therefore to provide coupling arrangements which employ printed circuit techniques and are capable of operating over a wide band of frequencies.

It is a further object of this invention to provide hybrid junction type coupling arrangements which employ printed circuit techniques and which exhibit good hybrid characteristics in regard to power split, isolation, and impedance match.

A still further object is to provide hybrid junction coupling arrangements which possess good shielding characteristics and are simple in construction and reliable in operation.

These objects are attained in accordance with a preferred embodiment of the invention wherein a pair of planar sheet-like outer conductors are disposed in spaced parallel relationship and are electrically connected to each other. A pair of planar inner conductors are disposed in different planes, in register, in parallel with and in insulated spaced relation between said outer conductors. These planar inner conductors are likewise electrically interconnected and each comprises a first branch arm of substantially U-shaped configuration and second and third arms perpendicular to said first arm and connected to respective legs of said U at the extremities thereof. The second and third branch arms are electrically connected at their free ends to the outer conductors, and all of the aforementioned arms are of a length substantially equal to an odd multiple of quarter wavelengths at the mean frequency of the microwave energy to be propagated therein. The inner planar conductors further comprise a fourth branch arm electrically connected to the junction of said first and second arms and a fifth branch arm connected to the junction of said first and third arms. A coupling conductor is disposed in insulated spaced relation between said inner conductors and it extends coextensively with said second and third arms. In typical hybrid fashion, microwave energy fed to the first branch arms of said inner conductors will be delivered equally to the fourth and fifth branch arms in phase and energy fed to said coupling conductor will be delivered equally to said fourth and fifth arms out of phase.

In a further embodiment of the invention one of the planar inner conductors is eliminated and the coupling conductor is disposed in substantially the same plane as the other remaining inner conductor. As in the first-mentioned embodiment, this coupling conductor is in insulated spaced relation with respect to the second and third branch arms of said remaining inner conductor and it is essentially coextensive therewith. This second embodiment requires less material and therefore is somewhat less expensive to make.

Other objects and many of the attendant advantages of the invention will be readily appreciated as the same becomes better understood by reference to the following detailed description when considered in connection with the accompanying drawings in which.

Figure 1:
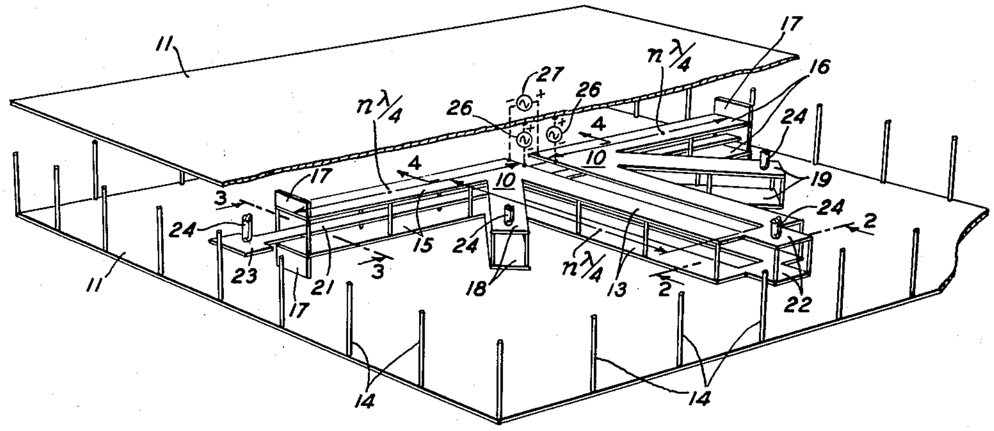
FIG. 1 is a partially exploded view in perspective with insulation removed of a hybrid junction type coupling arrangement in accordance with the principles of the present invention.
Figure 2:
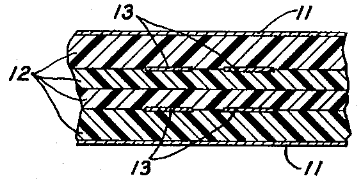
FIG. 2 is a cross-sectional view taken along line 2—2 of FIG. 1.
Figures 3, 4:
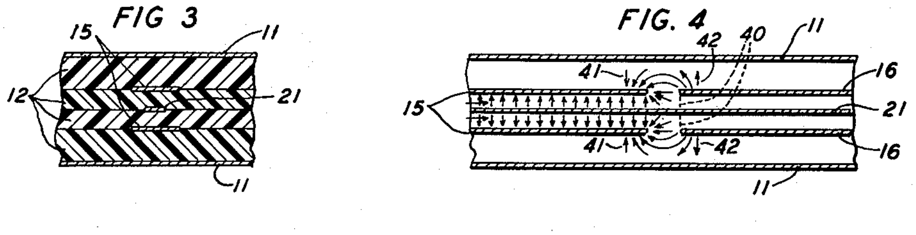
FIG. 3 is a cross-sectional view taken along line 3—3 of FIG. 1.
FIG. 4 is a cross-sectional view taken along the line 4—4 of FIG. 1 with insulation omitted so as to show the lines of electric field intensity in the vicinity of the junction.

Referring now to FIGS. 1 to 3 of the drawings, the microwave coupling arrangement illustrated is of the printed circuit type comprising a pair of outer or ground plane conductors 11 disposed in spaced parallel relationship. These ground plane conductors comprise thin sheets of conductive material which are separated by a plurality of layers of dielectric material 12, as shown in FIGS. 2 and 3. For purposes of clarity, only the conductive material has been shown in FIG. 1. As will be clear to those skilled in the art, the conductive material can be applied to the several layers of insulation in the form of conductive paint or ink, or the conductive material can be chemically deposited by being sprayed through a stencil or dusted onto selected surfaces of the insulation according to known printed circuit techniques. Alternatively, conductive strips can be cut and applied by a die-stamping operation. Also, the conductive strips of desired configuration can be obtained by etching away the undesired portions of a conductive coating applied to a dielectric layer. The dielectric material may be of polystyrene, polyethylene, polytetrafluoroethylene ("Teflon"), fiberglass, or laminated fiberglass impregnated with "Teflon," quartz, or other suitable material of high dielectric quality.

A pair of planar inner conductors 10 are disposed in different planes, in register with each other, in parallel with and in insulated spaced relation between the outer ground plane conductors 11. As will be clear from FIG. 2, each inner conductor 10 and adjacent outer conductor 11 can be plated upon opposite surfaces of the same sheet of dielectric material or, alternatively, they can be plated on separate sheets of dielectric material. The inner conductors 10 are electrically interconnected by pins, small diameter grommets or screws, and the like.

The pair of ground plane conductors are likewise electrically interconnected by pins or grommets 14.

The planar inner conductors 10 each comprise a first branch arm 13 of generally U-shaped configuration, the legs of said U being essentially of the same width so as to provide equal power division of the energy fed to the input thereof. The conductors 10 further comprise collinear second and third branch arms 15, 16, respectively, which are perpendicular to said first branch arm and are integrally connected to respective legs of said U at the extremities thereof. The second and third branch arms are electrically connected at their free ends to the outer ground plane conductors 11. As shown in FIG. 1, these connections are made by means of thin metal strips 17, but here again thin pins, grommets, or the like may be used.

As indicated in FIG. 1, all of the aforementioned branch arms are of a length substantially equal to an odd multiple of quarter wavelengths ($n\lambda/4$) at the mean frequency of the microwave energy to be propagated therein. In most instances, for space reasons, these arms will be a quarter wavelength ($\lambda/4$) in length.

Each of the planar inner conductors 10 further comprise a fourth branch arm 18 which is integrally connected to the junction of the first and second branch arms and a fifth branch arm 19 which is integral with the junction of the first and third arms. The length of these arms is not critical.

A coupling conductor 21 is disposed in insulated spaced relation between, and parallel to, said inner planar conductors 10. This coupling conductor is essentially coextensive with the aligned branch arms 15 and 16, that is, it extends from the said free end of one of the arms to the said free end of the other.

For low loss transmission, the branch arms 15, 16 should be of a width at least two and one-half to three times that of the coupling conductor 21. The width of the several branch arms is otherwise not critical and, as will be clear to those in the art, it will be chosen along with the other parameters (for example, separation of ground planes, the dielectric constant of the insulating material, et cetera) so as to provide a predetermined characteristic impedance.

The branch arms 13 and the coupling conductor 21 are provided with short integral extensions 22, 23, respectively, to which energy can be applied by means of conventional lead-in conductors 24, the latter extending in an insulated manner through holes provided in the uppermost ground plane conductor.

The coupling arrangement of FIG. 1 operates in typical hybrid fashion. The microwave energy delivered to the input branch arms 13 divides equally at the bifurcation thereof, with each half then traveling toward the junction in phase. In this instance, the electric field is concentrated between the respective legs of branch arms 13 and the adjacent ground plane conductors, the propagation being in the TEM mode. The branch arms 15 and 16 are short circuited at their said free ends to the ground plane conductors 11 and since these arms are of a length equal to an odd multiple of quarter wavelengths at the operating frequency, a high impedance is reflected back to the junction with the result that little, if any, of the microwave energy appears between respective branch arms 15 and 16 and the adjacent ground plane conductors.

There is an open circuit between the inner coupling conductor 21 and the branch arms 16 at the said free ends of the latter and, therefore, a very low impedance or short circuit between the same appears at the junction. Accordingly, except for a standing wave field existing between conductor 21 and arms 16, no electric field is established between said conductor and arms and no microwave energy appears therebetween.

As indicated above, the electric fields existing between the respective legs of branch arms 13 and the adjacent ground plane conductors 11 are in phase and essentially the same magnitude. Hence, at the junction, the respective legs are at the same instantaneous potential with respect to the ground planes. However, at the junction the branch arms 16 are effectively shorted to coupling conductor 21 and the latter, therefore, is at this very same instantaneous potential. Accordingly, there is no potential difference, at the junction, between the coupling conductor 21 and branch arms 15 and these elements likewise appear to be shorted and no microwave energy appears therebetween.

The microwave energy is, therefore, substantially all delivered to the branch arms 18 and 19 (that is, the electric fields are concentrated between these branch arms and the adjacent ground planes) in parallel and hence in phase. This is indicated symbolically in FIG. 1 by the alternating current generator symbols 26. These symbols represent the microwave energy that appears between the planar inner conductors 10 and ground plane conductors 11 at the junction. The two fields, represented by symbols 26, are of equal magnitude and in phase and each delivers energy to one of the respective branch arms 18, 19, the energy in the latter, therefore, being likewise of equal magnitude and in phase.

Again, in typical hybrid fashion, the microwave energy delivered to the input of coupling conductor 21 is transferred to the branch arms 18 and 19 out of phase with no energy appearing at the conjugate port (that is, the output of branch arms 13). The input excitation voltage is applied directly between the conductor 21 and the ground planes 11, but, inasmuch as the branch arms 15 are shorted to the ground planes at 17, the electric field of the energy propagating toward the junction appears primarily between the conductor 21 and adjacent branch arms 15 (again, in the TEM mode).

Referring now to FIG. 4, there are shown the lines of electric field intensity that exist at the junction. The effective short, appearing at the junction between conductor 21 and arms 16, is represented by dotted lines 40. As indicated in this figure, the microwave energy propagated toward the junction results in the establishment of the fields 41, 42 which are 180 degrees out of phase. As will be clear to those in the art, this performance is somewhat analogous to that which occurs in a waveguide when energy is delivered to the series arm.

The potential that exists across the discontinuity or gap separating arms 15 and 16 is indicated symbolically in FIG. 1 by the alternating current generator symbol 27. Generator 27, or rather the potential represented thereby, delivers energy to the arms 18 and 19 in series (that is, 180 degrees out of phase) with no energy appearing at the output, or rather the input, of branch arms 13. In this latter regard, the legs of the respective branch arms 13 are short circuited at the base of the U and therefore a high impedance therebetween appears at the junction which is an odd number of quarter wavelengths away. Accordingly, little, if any, microwave energy is propagated along arms 13.

The hybrid junction arrangement of FIG. 1 is symmetrical and thus the input microwave energy could, as readily, have been fed to that end of the coupling conductor adjacent the said free ends of branch arms 16.

Figure 5:
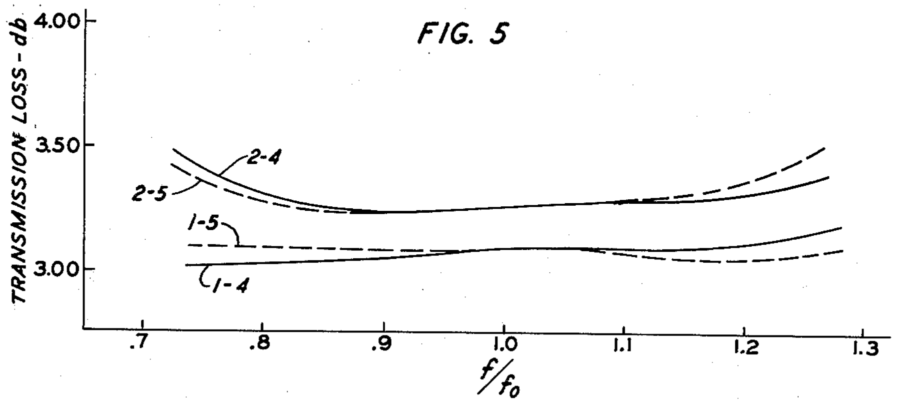
FIG. 5 is a family of curves illustrating the bandwidth characteristics of a hybrid junction coupling arrangement constructed in accordance with the present invention.

In FIG. 5 there is shown a family of curves illustrating the band pass characteristics of a hybrid junction coupling arrangement constructed in accordance with the present invention. The curves 1—4 and 1—5 represent the transmission loss (i.e., degree of energy coupling) to the fourth and fifth branch arms (e.g., arms 18 and 19) when microwave energy is fed to the first branch arm (e.g., interconnected branch arms 13). Likewise, curves 2—4 and 2—5 show the transmission loss to said fourth and fifth arms when energy is delivered to terminal 2, that is, coupling conductor 21. These curves were obtained with a midband frequency ($f_0$) of 500 megacycles. The power split between the arms or ports 4 and 5 approaches the ideal of one-half or 3 db in both instances. Also, the curves show a difference of power split of less than 0.1 db over a very wide band.

Figure 6:
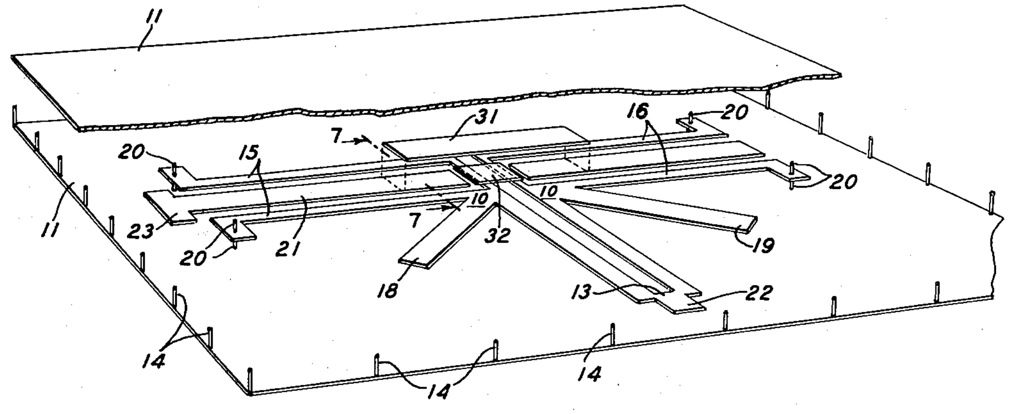
FIG. 6 is a partially exploded view in perspective with insulation removed of a further embodiment constructed in accordance with the present invention.
Figure 7:
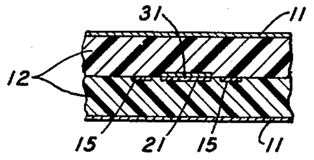
FIG. 7 is a cross-sectional view taken along the line 7—7 of FIG. 5.

In the embodiment of this invention shown in FIGS. 6 and 7, one of the planar inner conductors 10 is eliminated. The remaining inner conductor 10 is disposed, as in the previous case, in parallel with and in insulated spaced relation between the parallel ground plane conductors 11. Again, as in the above-described embodiment, the inner conductor 10 comprises a first branch arm 13 of generally U-shaped configuration and collinear second and third branch arms 15 and 16 which are perpendicular to said first branch arm and are integrally connected to respective legs of said U at the extremities thereof. In this instance, the second and third branch arms 15, 16 are split or divided along their length and the divided parts or longitudinal sections thereof are separated a sufficient distance to permit the coupling conductor 21 to lie in insulated spaced relation therebetween. The free ends of the separated halves of arms 15, 16 are connected, by pins or grommets 20, to the ground plane conductors 11. As with the previous embodiment, all of the aforementioned branch arms are of a length substantially equal to an odd multiple of quarter wavelengths at the operating frequency.

The planar inner conductor 10 also comprises fourth and fifth branch arms 18 and 19 connected as shown.

As in the first embodiment, the inner coupling conductor 21 is in insulated spaced relation with respect to the branch arms 15 and 16 and it extends from the said free end of one of said arms to the said free end of the other. To this end, conductor 21 comprises three sections, the first of which extends from the said free end of arm 15 to a point just short of one of the legs of branch arm 13. A second section extends from the said free end of arm 16 to a point just short of the other leg of arm 13 and a third section 31 serves as a bridge or jumper electrically interconnecting the first and second sections. As indicated in FIG. 7, the first (and, of course, second) section of conductor 21 is plated on the inner surface of one of the layers of insulating material 12 and the third section 31 is plated on the inner surface of the other layer 12 so that when said layers are pressed together the third section 31 contacts said first and second sections. However, before the layers of insulating material are pressed together a sheet of dielectric 32 is positioned as shown in FIG. 6. Sheet 32 prevents the section 31 from contacting the legs of branch arm 13. The bridging section 31 can overlie all or a portion of the first and second sections of conductor 21, the extent of the overlie being immaterial so long as good electrical contact is assured.

For good transmission characteristics, the separated halves of branch arms 15 and 16 should, in this embodiment, be of a width approximately one-third that of coupling conductor 21. The other parameters of the device, here again, are selected so as to provide a predetermined characteristic impedance.

The branch arm 13 and the coupling conductor 21 are provided with short integral extensions 22, 23, respectively, to which energy can be applied by conventional lead-in means (not shown).

The embodiment of FIG. 6 operates in substantially the same manner as the embodiment shown in FIG. 1. The microwave energy delivered to the input of branch arm 13 divides equally at the bifurcation, with each half then traveling toward the junction in phase (again, in the TEM mode). With the exception of standing wave fields, no electric field is established between the branch arms 15, 16 and the ground planes 11 nor between said branch arms and conductor 21, and hence none of the energy is lost thereto. The microwave energy is, therefore, substantially all delivered to the branch arms 18 and 19 in parallel.

The microwave energy delivered to the coupling conductor 21 travels toward the junction with most of the field thereof concentrated between conductor 21 and the juxtaposed longitudinal sections of branch arm 15. As in the previous case, a potential is developed across the discontinuity or gap separating arms 15 and 16, i.e., two fields 180 degrees out of phase are established at the junction. The microwave energy is thence delivered to the fourth and fifth arms (arms 18 and 19) in series with no energy appearing at the conjugate port arm 13.

While the present invention has been described by reference to particular embodiments thereof, it will be understood that numerous modifications may be made by those skilled in the art without departing from the spirit and scope of the invention.

What is claimed is:

1. A hybrid junction coupling arrangement comprising a pair of electrically interconnected planar sheet-like outer conductors, insulating means for maintaining said outer conductors in dielectrically spaced substantially parallel relation, a planar inner conductor in parallel with and in insulated spaced relation between said outer conductors, said inner conductor comprising a first branch arm of substantially U-shaped configuration and collinear second and third branch arms perpendicular to said first arm and integrally connected to respective legs of said U at the extremities thereof, each of said arms being equal to an odd multiple of quarter wavelengths at the mean frequency of the microwave energy applied to said hybrid junction, said second and third arms being electrically connected at their free ends to said outer conductors, said inner conductor further comprising a fourth branch arm integrally connected to the junction of said first and second arms and a fifth branch arm integrally connected to the junction of said first and third arms, said second and third arms each being divided into a pair of longitudinally extending sections which are separated a predetermined distance, a first elongated conductor disposed in the same plane as said inner conductor and in insulated spaced relation between said longitudinal sections of said second arm and extending from said free end of the latter to a point just short of the junction of said first and second arms, a second elongated conductor also disposed in the same plane as said inner conductor and in insulated spaced relation between said longitudinal sections of said third arm and extending from said free end of the latter to a point just short of the junction of said first and third arms, and means electrically interconnecting said first and second elongated conductors at the proximate ends thereof.

2. A hybrid junction coupling arrangement as defined in claim 1 wherein said electrical interconnecting means comprises a third elongated planar conductor extending collinearly with respect to said first and second elongated conductors and overlying and in electrical contact with at least the proximate ends of the latter, said third conductor being electrically insulated from said branch arms.

References Cited in the file of this patent

UNITED STATES PATENTS 2,913,686 Fubini ---------------- Nov. 17, 1959

OTHER REFERENCES

Alford: "A Wide Band Coaxial Hybrid" I.R.E. Convention Record 1956, Vol. 4, Part 1, pages 171—179.